(12) United States Patent  
Imai

(10) Patent No.: US 7,482,177 B2  
(45) Date of Patent: Jan. 27, 2009

(54) METHOD FOR MANUFACTURING OPTICAL DEVICE, AND OPTICAL DEVICE WAFER

(75) Inventor: Yasutaka Imai, Chino (JP)

(73) Assignee: Seiko Epson Corporation (JP)

( * ) Notice: Subject to any disclaimer, the term of this patent is extended or adjusted under 35 U.S.C. 154(b) by 41 days.

(21) Appl. No.: 11/769,234

(22) Filed: Jun. 27, 2007

(65) Prior Publication Data

US 2008/0013575 A1    Jan. 17, 2008

(30) Foreign Application Priority Data

Jul. 14, 2006 (JP) ............................ 2006-194188  
Apr. 16, 2007 (JP) ............................ 2007-106844

(51) Int. Cl.  
*H01L 21/00* (2006.01)

(52) U.S. Cl. .................. 438/7; 438/8; 438/9; 438/16; 438/29; 438/31; 438/35; 438/716; 438/718; 438/737; 438/750

(58) Field of Classification Search ............ 438/7, 438/8, 9, 16, 29, 31, 35, 716, 718, 723, 724, 438/737, 743, 744, 750, 756, 757  
See application file for complete search history.

(56) References Cited

U.S. PATENT DOCUMENTS

2003/0020856 A1* 1/2003 Furuhashi et al. ........... 349/122

2004/0027701 A1* 2/2004 Ishikwa ...................... 359/883  
2004/0207029 A1* 10/2004 Braddock ................... 257/410  
2004/0262612 A1* 12/2004 Vidal et al. .................. 257/72

FOREIGN PATENT DOCUMENTS

| JP | 10-135568 | 5/1998 |
|---|---|---|
| JP | 2000-164982 | 6/2000 |
| JP | 2002-111054 | 4/2002 |

* cited by examiner

*Primary Examiner*—Thanh V Pham  
(74) *Attorney, Agent, or Firm*—Harness, Dickey & Pierce, P.L.C.

(57) ABSTRACT

A method for manufacturing an optical device includes the steps of: forming a first multilayer film, including forming a first mirror above a substrate, forming an active layer above the first mirror, forming a second mirror above the active layer, forming a semiconductor layer on the second mirror, and forming a sacrificial layer on the semiconductor layer; conducting a first examination step of conducting a reflectance examination on the first multilayer film; forming a second multilayer film by removing the sacrificial layer from the first multilayer film; conducting a second examination step of conducting a reflection coefficient examination on the second multilayer film; and patterning the second multilayer film to form a surface-emitting laser section having the first mirror, the active layer and the second mirror, and a diode section having the semiconductor layer, wherein the sacrificial layer is formed to have an optical film thickness of an odd multiple of $\lambda/4$, where $\lambda$ is a design wavelength of light emitted by the surface-emitting laser section.

11 Claims, 7 Drawing Sheets

METHOD FOR MANUFACTURING OPTICAL DEVICE, AND OPTICAL DEVICE WAFER

The entire disclosure of Japanese Patent Application Nos: 2006-194188, filed Jul. 14, 2006 and 2007-106844, filed Apr. 16, 2007 are expressly incorporated by reference herein.

BACKGROUND

1. Technical Field

Several aspects of the present invention relate to methods for manufacturing optical devices, and optical device wafers.

2. Related Art

A surface-emitting type semiconductor laser has a characteristic in which its optical output changes depending on the ambient temperature. For this reason, an optical module that uses a surface-emitting type semiconductor laser may be equipped with a photodetecting function for detecting a portion of a laser beam emitted from the surface-emitting type semiconductor laser to monitor its optical output value. For example, a photodetector device such as a photodiode may be provided on a surface-emitting type semiconductor laser, whereby a portion of a laser beam emitted from the surface-emitting type semiconductor laser can be monitored within the same device. For example, Japanese laid-open patent application JP-A-10-135568 is an example of related art.

SUMMARY

In accordance with an advantage of some aspects of the invention, there is provided a method for manufacturing an optical device including a surface-emitting laser section and a diode section and having desired characteristics. Also, an optical device wafer that is used in the aforementioned method for manufacturing an optical device is provided.

In accordance with an embodiment of the invention, a first method for manufacturing an optical device includes the steps of:

forming a first multilayer film, including forming a first mirror above a substrate, forming an active layer above the first mirror, forming a second mirror above the active layer, forming a semiconductor layer on the second mirror, and forming a sacrificial layer on the semiconductor layer;

conducting a first examination step of conducting a reflectance examination on the first multilayer film;

forming a second multilayer film by removing the sacrificial layer from the first multilayer film;

conducting a second examination step of conducting a reflectance examination on the second multilayer film; and patterning the second multilayer film to form a surface-emitting laser section having the first mirror, the active layer and the second mirror, and a diode section having the semiconductor layer, wherein an optical film thickness of the sacrificial layer is formed to be an odd multiple of $\lambda/4$, where $\lambda$ is a design wavelength of light emitted by the surface-emitting laser section.

According to the method for manufacturing an optical device, a reflectance profile of the first multilayer film is obtained by the first examination step, and a reflectance profile of the second multilayer film is obtained by the second examination step, such that the multilayer film obtained by forming layers above the substrate can be accurately evaluated. By this, manufacture of an optical device with a defective multilayer film can be avoided beforehand. Accordingly, by the method for manufacturing an optical device, optical devices having desired characteristics can be securely provided.

It is noted that, in descriptions concerning the invention, the term "above" may be used, for example, in a manner as "a specific member (hereafter referred to as 'B') formed 'above' another specific member (hereafter referred to as 'A')." In descriptions concerning the invention, the term "above" is used, in such an exemplary case described above, assuming that the use of the term includes a case in which "B" is formed directly on "A," and a case in which "B" is formed over "A" through another member on "A."

Also, in the present invention, the "design wavelength" is a wavelength of light that is expected, at a designing stage in designing an optical device, to have the maximum intensity among light emitted from the surface-emitting laser.

Also, in the present invention, the "optical film thickness" is a value obtained by multiplying an actual film thickness of a layer and a refractive index of material composing the layer.

In the method for manufacturing an optical device in accordance with an aspect of the embodiment of the invention, an optical film thickness of the semiconductor layer may be formed to be an odd multiple or an even multiple of $\lambda/4$.

It is noted that, in the present invention, the case of being an odd multiple of $\lambda/4$ may include a case of perfectly matching with an odd multiple of $\lambda/4$ and a case of generally matching with an odd multiple of $\lambda/4$. Similarly, in the present invention, the case of being an even multiple of $\lambda/4$ may include a case of perfectly matching with an even multiple of $\lambda/4$ and a case of generally matching with an even multiple of $\lambda/4$.

In the method for manufacturing an optical device in accordance with an aspect of the embodiment of the invention, an optical film thickness of the semiconductor layer may be formed to be an odd multiple of $\lambda/4$, a reflection band of the first mirror and the second mirror may be measured in the first examination step, and a Fabry-Perot wavelength of light emitted by the surface-emitting laser section may be measured in the second examination step.

It is noted that, in the present invention, the "Fabry-Perot wavelength of light that is emitted by the surface-emitting laser section" is a wavelength of light having the maximum intensity among light that is actually emitted by the surface-emitting laser section.

In the method for manufacturing an optical device in accordance with an aspect of the embodiment of the invention, an optical film thickness of the semiconductor layer may be formed to be an even multiple of $\lambda/4$, a Fabry-Perot wavelength of light emitted by the surface-emitting laser section may be measured in the first examination step, and a reflection band of the first mirror and the second mirror may be measured in the second examination step.

In the method for manufacturing an optical device in accordance with an aspect of the embodiment of the invention, in the step of removing the sacrificial layer, a layer among the semiconductor layer in contact with the sacrificial layer may function as an etching stopper layer.

In the method for manufacturing an optical device in accordance with an aspect of the embodiment of the invention, the sacrificial layer may be formed from InGaP, and the layer among the semiconductor layer in contact with the sacrificial layer may be formed from AlGaAs or GaAs.

In the method for manufacturing an optical device in accordance with an aspect of the embodiment of the invention, the sacrificial layer may be formed from AlGaAs, and the layer among the semiconductor layer in contact with the sacrificial layer may be formed from GaAs.

In the method for manufacturing an optical device in accordance with an aspect of the embodiment of the invention, the diode section may be formed to be a photodetector section, and the semiconductor layer may be formed to include a photoabsorption layer.

It is noted that, in the present invention, the "photoabsorption layer" conceptually includes a depletion layer.

In the method for manufacturing an optical device in accordance with an aspect of the embodiment of the invention, the semiconductor layer may include a first contact layer of a first conductivity type, and a second contact layer of a second conductivity type formed above the first contact layer.

In the method for manufacturing an optical device in accordance with an aspect of the embodiment of the invention, the first mirror and the second mirror may be formed from distributed Bragg reflection type mirrors, and an optical film thickness of each layer in the distributed Bragg reflection type mirrors may be $\lambda/4$.

In accordance with an embodiment of the invention, a second method for manufacturing an optical device includes the steps of:

forming a first multilayer film, including forming a first mirror above a substrate, forming an active layer above the first mirror, forming a second mirror above the active layer, forming a semiconductor layer on the second mirror, and forming a sacrificial layer on the semiconductor layer;

conducting a first examination step of conducting a reflectance examination on the first multilayer film;

forming a second multilayer film by removing the sacrificial layer from the first multilayer film;

conducting a second examination step of conducting a reflectance examination on the second multilayer film; and patterning the second multilayer film to form a surface-emitting laser section having the first mirror, the active layer and the second mirror, and a diode section having the semiconductor layer, wherein, in the first examination step, a first measurement of measuring a reflection band of the first mirror and the second mirror or a second measurement of measuring a Fabry-Perot wavelength of light emitted by the surface-emitting laser section is conducted; and in the second examination step, the second measurement is conducted when the first measurement is conducted in the first examination step, and the first measurement is conducted when the second measurement is conducted in the first examination step.

In accordance with still another embodiment of the invention, an optical device wafer includes:

a substrate;

a first mirror formed above the substrate;

an active layer formed above the first mirror;

a second mirror formed above the active layer;

a semiconductor layer formed on the second mirror; and a sacrificial layer formed on the semiconductor layer, wherein the first mirror, the active layer and the second mirror are used to form at least a portion of a surface-emitting laser section, the semiconductor layer is used to form at least a portion of a diode section, and an optical film thickness of the sacrificial layer is an odd multiple of $\lambda/4$, where $\lambda$ is a design wavelength of light that is emitted by the surface-emitting laser section.

In the optical device wafer in accordance with an aspect of the embodiment of the invention, an optical film thickness of the semiconductor layer may be an odd multiple or an even multiple of $\lambda/4$.

DESCRIPTION OF EXEMPLARY EMBODIMENTS

Preferred embodiments of the invention are described below with reference to the accompanying drawings.

1. First, an optical device 100 in accordance with an embodiment of the invention is described.

Figure 1:
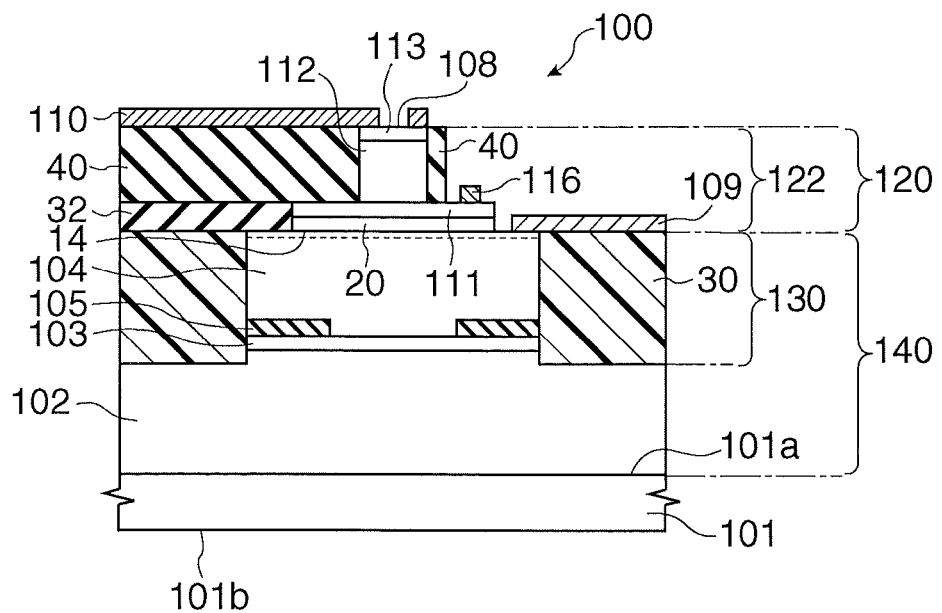
FIG. 1 is a schematic cross-sectional view of an optical device in accordance with an embodiment of the invention.
Figure 2:
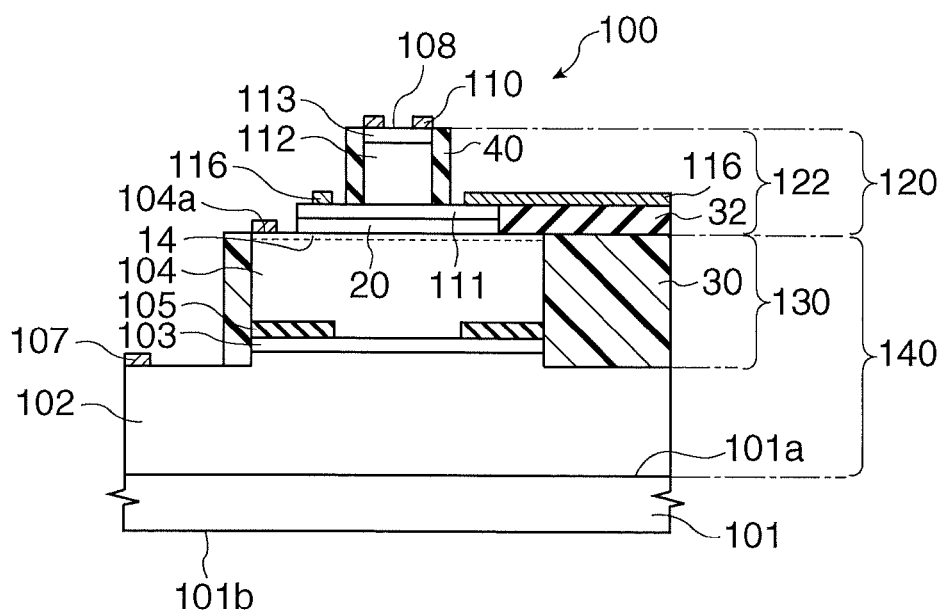
FIG. 2 is a schematic cross-sectional view of the optical device in accordance with the embodiment.
Figure 3:
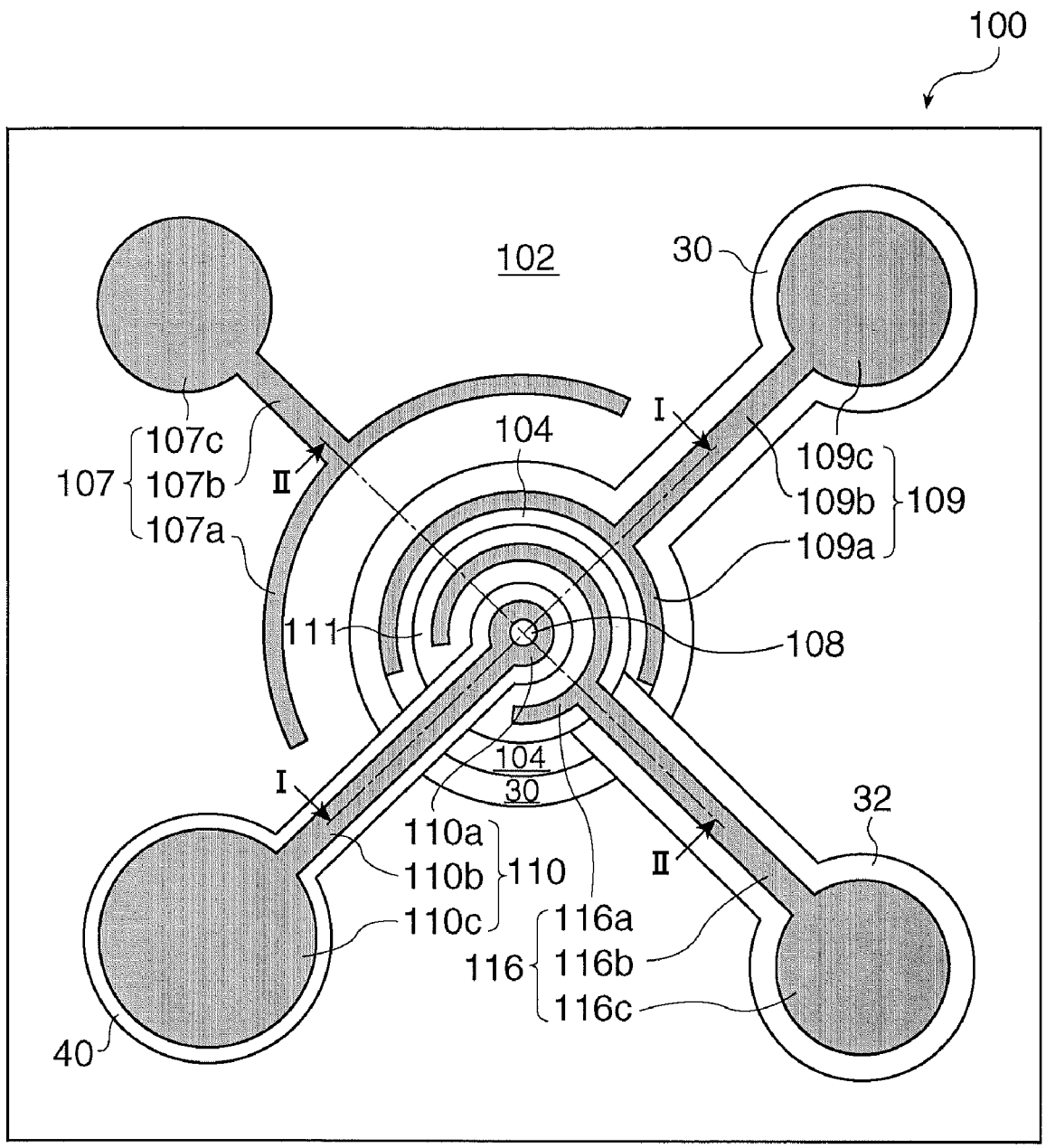
FIG. 3 is a schematic plan view of the optical device in accordance with the embodiment.

FIG. 1 and FIG. 2 are schematic cross-sectional views of the optical device 100, and FIG. 3 is a schematic plan view of the optical device 100. It is noted that FIG. 1 is a cross-sectional view taken along a line I-I of FIG. 3, and FIG. 2 is a cross-sectional view taken along a line II-II of FIG. 3.

The optical device 100 in accordance with the present embodiment may include, as shown in FIG. 1 through FIG. 3, a substrate 101, a surface-emitting laser section 140, a diode section 120, first-fourth electrodes 107, 109, 116 and 110, and first-third dielectric layers 30, 32 and 40.

As the substrate 101, for example, a GaAs substrate of a first conductivity type (for example, n-type) may be used.

The surface-emitting laser section 140 is formed on the substrate 101. The surface-emitting laser section 140 includes a first mirror 102 of the first conductivity type (n-type), an active layer 103 formed on the first mirror 102, and a second mirror 104 of a second conductivity type (for example, p-type) formed on the active layer 103. More concretely, the first mirror 102 is, for example, a distributed Bragg reflection type (DBR) mirror of 40.5 pairs of alternately laminated n-type $Al_{0.9}Ga_{0.1}As$ layers and n-type $Al_{0.12}Ga_{0.88}As$ layers. The active layer 103 has a multiple quantum well (MQW) structure in which quantum well structures each formed from, for example, a GaAs well layer and an $Al_{0.3}Ga_{0.7}As$ barrier layer are laminated in three layers. The second mirror 104 includes, for example, a DBR mirror of 23 pairs of alternately laminated p-type $Al_{0.9}Ga_{0.1}As$ layers and p-type $Al_{0.12}Ga_{0.88}As$ layers, and a p-type GaAs layer (the topmost layer of the second mirror 104) 14 formed thereon. Each layer in the DBR mirrors has an optical film thickness of $\lambda/4$. It is noted that $\lambda$ is a design wavelength of light that is emitted by the surface-emitting laser section 140. It is noted that the composition of each of the layers and the number of the layers composing the first mirror 102, the active layer 103 and the second mirror 104 are not particularly limited to the above.

The first mirror 102, the active layer 103 and the second mirror 104 can form a vertical resonator. The p-type second mirror 104, the active layer 103 that is not doped with an impurity and the n-type first mirror 102 form a pin diode. A portion of the first mirror 102, the active layer 103 and the second mirror 104 may form, for example, a columnar semiconductor laminate (hereafter referred to as a "columnar section") 130. The columnar section 130 has a plane configuration that is, for example, in a circular shape.

Also, as shown in FIG. 1 and FIG. 2, for example, at least one of the layers composing the second mirror 104 can be formed as a current constricting layer 105. The current constricting layer 105 is formed in a region near the active layer 103. As the current constricting layer 105, for example, an oxidized AlGaAs layer can be used. The current constricting layer 105 is a dielectric layer having an opening section, and is formed in a ring shape.

The first electrode 107 is formed on a top surface of the first mirror 102. The first electrode 107 is electrically connected to the first mirror 102. The first electrode 107 may include a contact section 107a, a lead-out section 107b and a pad section 107c, as shown in FIG. 3. The first electrode 107 is in contact with the first mirror 102 at the contact section 107a. The lead-out section 107b of the first electrode 107 connects the contact section 107a with the pad section 107c. The pad section 107c of the first electrode 107 is connected as an electrode pad to an external wiring or the like. The first electrode 107 may be formed from a multilayer film in which, for example, layers of an alloy of gold (Au) and germanium (Ge), and gold (Au) are laminated in this order. It is noted that, in the illustrated example, the first electrode 107 is provided on the first mirror 102. However, the first electrode 107 may be provided at a back surface 101b of the substrate 101.

The second electrode 109 is formed on the second mirror 104 and the first dielectric layer 30. The second electrode 109 is electrically connected to the second mirror 104. The second electrode 109 may include a contact section 109a, a lead-out section 109b and a pad section 109c, as shown in FIG. 3. The second electrode 109 is in contact with the second mirror 104 at the contact section 109a. The lead-out section 109b of the second electrode 109 connects the contact section 109a with the pad section 109c. The pad section 109c of the second electrode 109 is connected as an electrode pad to an external wiring or the like. The second electrode 109 may be formed from a multilayer film in which, for example, layers of platinum (Pt), titanium (Ti) and gold (Au) are laminated in this order.

The first dielectric layer 30 is formed on the first mirror 102. The first dielectric layer 30 is formed in a manner to surround the columnar section 130. The lead-out section 109b and the pad section 109c of the second electrode 109 are formed on the first dielectric layer 30. The first dielectric layer 30 can electrically isolate the second electrode 109 from the first mirror 102. For example, as the first dielectric layer 30, a resin layer composed of polyimide resin or the like can be used.

The second dielectric layer 32 is formed on the second mirror 104 and the first dielectric layer 30. The second dielectric layer 32 is formed in contact with a portion of the side surface of the columnar section composed of the isolation layer 20 and the first contact layer 111. A lead-out section 116b and a pad section 116c of the third electrode 116 are formed on the second dielectric layer 32. The second dielectric layer 32 can electrically isolate the third electrode 116 from the second mirror 104. For example, as the second dielectric layer 32, an inorganic dielectric layer composed of silicon oxide or the like can be used.

The diode section 120 is formed on the surface-emitting laser section 140. The diode section 120 can function, for example, as a photodetector section. The diode section 120 can monitor, for example, an output of light generated by the surface-emitting laser 140. The diode section 120 includes a semiconductor layer 122. The semiconductor layer 122 may be formed from, for example, a plurality of semiconductor layers. The semiconductor layer 122 may include, for example, an isolation layer 20, a first contact layer 111 formed on the isolation layer 20, a photoabsorption layer 112 formed on the first contact layer 111, and a second contact layer 113 formed on the photoabsorption layer 112.

The isolation layer 20 may be composed of AlGaAs of intrinsic semiconductor. The isolation layer 20 and the first contact layer 111 may compose, for example, a columnar semiconductor laminate (columnar section). The columnar section has a plane configuration that is, for example, a circular shape. The first contact layer 111 may be composed of, for example, an n-type GaAs layer. The photoabsorption layer 112 may be composed of, for example, a GaAs layer in which no impurity is doped. The second contact layer 113 may be composed of, for example, a p-type GaAs layer. An energy gap of the constituent material of at least one layer of the layers composing the semiconductor layer 122 is narrower than, for example, an energy gap of the constituent material of the first mirror 102 and the second mirror 104 of the surface-emitting laser section 140.

The p-type second contact layer 113, the photoabsorption layer 112 in which no impurity is doped, and the n-type first contact layer 111 form a pin diode. The second contact layer 113 and the photoabsorption layer 112 may form, for example, a columnar semiconductor laminate (columnar section). The columnar section has a plane configuration that is, for example, a circular shape.

The third electrode 116 is formed on the first contact layer 111 and the second dielectric layer 32. The third electrode 116 is electrically connected to the first contact layer 111. The third electrode 116 may include a contact section 116a, a lead-out section 116b and a pad section 116c, as shown in FIG. 3. The third electrode 116 is in contact with the first contact layer 111 at the contact section 116a. The lead-out section 116b of the third electrode 116 connects the contact section 116a with the pad section 116c. The pad section 116c of the third electrode 116 is connected as an electrode pad to an external wiring or the like. The third electrode 116 may be composed of the same material as that of, for example, the first electrode 107.

The fourth electrode 110 is formed on the second contact layer 113 and the third dielectric layer 40. The fourth electrode 110 is electrically connected to the second contact layer 113. The fourth electrode 110 may include a contact section 110a, a lead-out section 110b and a pad section 110c, as shown in FIG. 3. The fourth electrode 110 is in contact with the second contact layer 113 at the contact section 110a. The contact section 110a has an opening section on the second contact layer 113. The opening section forms an area where the contact section 110a is not formed on the top surface of the second contact layer 113. This area defines, for example, a laser emission surface 108. The lead-out section 110b of the fourth electrode 110 connects the contact section 110a with the pad section 110c. The pad section 110c of the fourth electrode 110 is connected as an electrode pad to an external wiring or the like. The fourth electrode 110 may be composed of the same material as that of, for example, the second electrode 109.

The third dielectric layer 40 is formed on the first contact layer 111 and the second dielectric layer 32. The third dielectric layer 40 is formed in a manner to surround the columnar section that is composed of the photoabsorption layer 112 and the second contact layer 113. The lead-out section 110b and the pad section 110c of the fourth electrode 110 are formed on the third dielectric layer 40. The third dielectric layer 40 can electrically isolate the fourth electrode 110 from the first contact layer 111. As the third dielectric layer 40, an inorganic dielectric layer composed of, for example, silicon oxide of the like can be used.

2. Next, an example of a method for manufacturing the optical device 100 in accordance with an embodiment of the invention is described with reference to the accompanying drawings.

Figure 4:
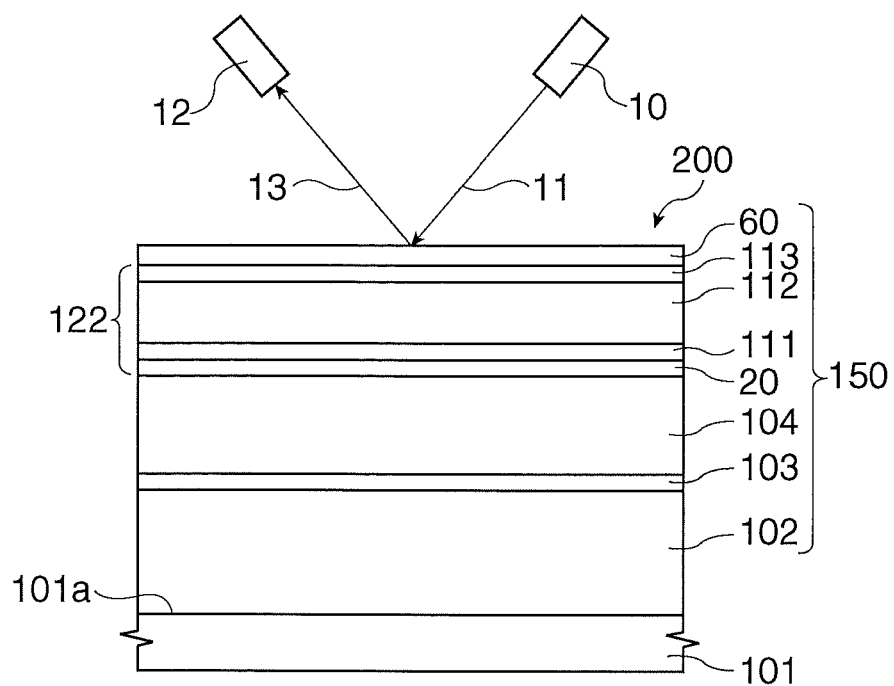
FIG. 4 is a cross-sectional view schematically showing a step in a method for manufacturing an optical device in accordance with an embodiment of the invention.
Figure 7:
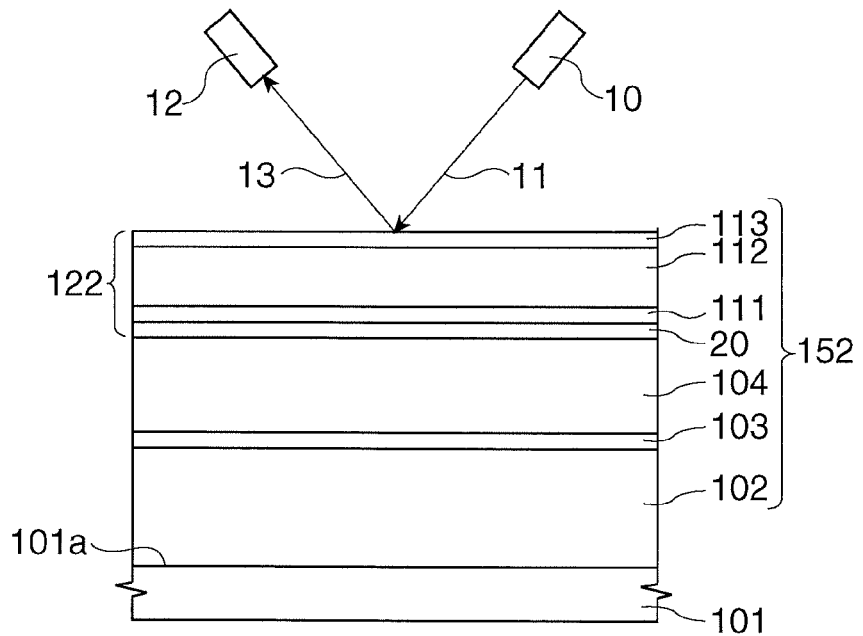
FIG. 7 is a cross-sectional view schematically showing a step in a method for manufacturing an optical device in accordance with an embodiment of the invention.
Figure 8:
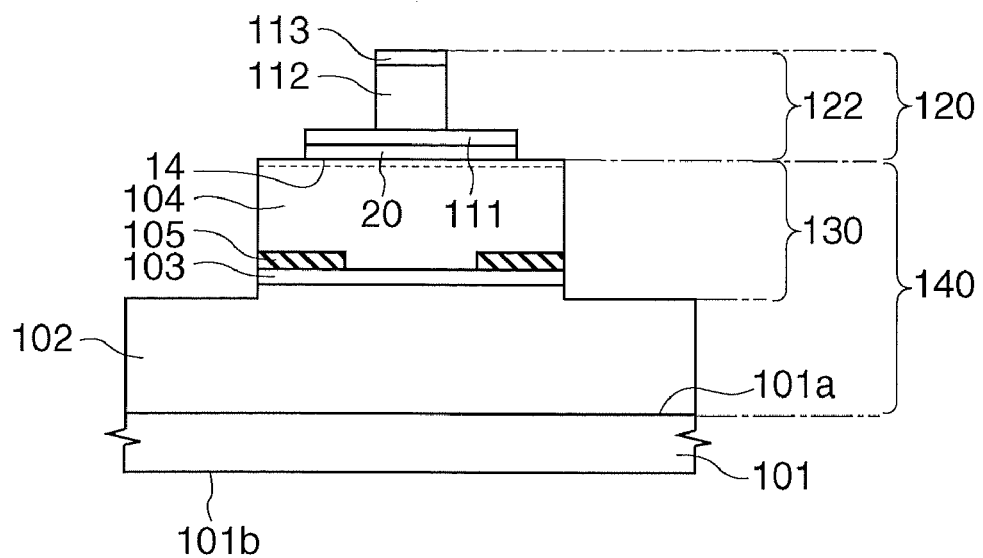
FIG. 8 is a cross-sectional view schematically showing a step in the method for manufacturing an optical device in accordance with the embodiment.

FIG. 4, FIG. 7 and FIG. 8 are cross-sectional views schematically showing a process for manufacturing the optical device 100 of the present embodiment shown in FIGS. 1-3, and correspond to the cross-sectional view shown in FIG. 1, respectively.

(1) First, as shown in FIG. 4, for example, an n-type GaAs substrate is prepared as a substrate 101. Then, a first semiconductor multilayer film 150 is formed on the substrate 101 by epitaxial growth while modifying its composition, whereby an optical device wafer 200 is obtained. Concretely, the optical device wafer 200 is obtained in the following manner.

First, semiconductor layers that compose a first mirror 102, an active layer 103 and a second mirror 104 are laminated on the substrate 101. When the second mirror 104 is grown, at least one layer thereof near the active layer 103 is formed to be a layer that is later oxidized and becomes a current constricting layer 105. As the layer to be oxidized, for example, an AlGaAs layer with its Al composition being 0.95 or higher may be used.

Then, a semiconductor layer 122 (more specifically, an isolation layer 20, a first contact layer 111, a photoabsorption layer 112 and a second contact layer 113) may be formed directly on the second mirror 104. The semiconductor layer 122 is formed to have an optical film thickness that is an odd multiple or an even multiple of $\lambda/4$. It is noted that $\lambda$ is a design wavelength of light that is emitted by the surface-emitting laser section 140.

For example, when the optical film thickness of the semiconductor layer 122 is set to be an odd multiple of $\lambda/4$, the optical film thickness of the isolation layer 20 may be set to an even multiple of $\lambda/4$, and the total optical film thickness of the first contact layer 111, the photoabsorption layer 112 and the second contact layer 113 (hereafter also referred to as the "pin section") may be set to an odd multiple of $\lambda/4$. Alternatively, for example, the optical film thickness of the isolation layer 20 may be set to an odd multiple of $\lambda/4$, and the optical film thickness of the pin section may be set to an even multiple of $\lambda/4$.

Also, for example, when the optical film thickness of the semiconductor layer 122 is set to be an even multiple of $\lambda/4$, for example, the optical film thickness of the isolation layer 20 may be set to an odd multiple of $\lambda/4$, and the optical film thickness of the pin section may be set to an odd multiple of $\lambda/4$. Alternatively, for example, the optical film thickness of the isolation layer 20 may be set to an even multiple of $\lambda/4$, and the optical film thickness of the pin section may be set to an even multiple of $\lambda/4$.

Then, a sacrificial layer 60 may be formed directly on the semiconductor layer 122. The sacrificial layer 60 may be formed to have an optical film thickness that is an odd multiple of $\lambda/4$. By this, for example, when the semiconductor layer 122 has an optical film thickness that is an odd multiple of $\lambda/4$, the total optical film thickness of the semiconductor layer 122 and the sacrificial layer 60 would become an even multiple of $\lambda/4$. Also, for example, when the semiconductor layer 122 has an optical film thickness that is an even multiple of $\lambda/4$, the total optical film thickness of the semiconductor layer 122 and the sacrificial layer 60 would become an odd multiple of $\lambda/4$.

By the steps described above, the first multilayer film 150 can be formed, and thus the optical device wafer 200 can be obtained.

(2) Next, a reflectance examination (first examination step) is conducted on the first multilayer film 150. The reflectance examination may be conducted, for example, as shown in FIG. 4, through irradiating light 11 from a light source 10 that emits white light through a diffraction grating (not shown) on a surface of the first multilayer film 150, and making reflected light 13 incident upon a photodetector device 12 such as a CCD through a mirror (not shown).

Figure 5:
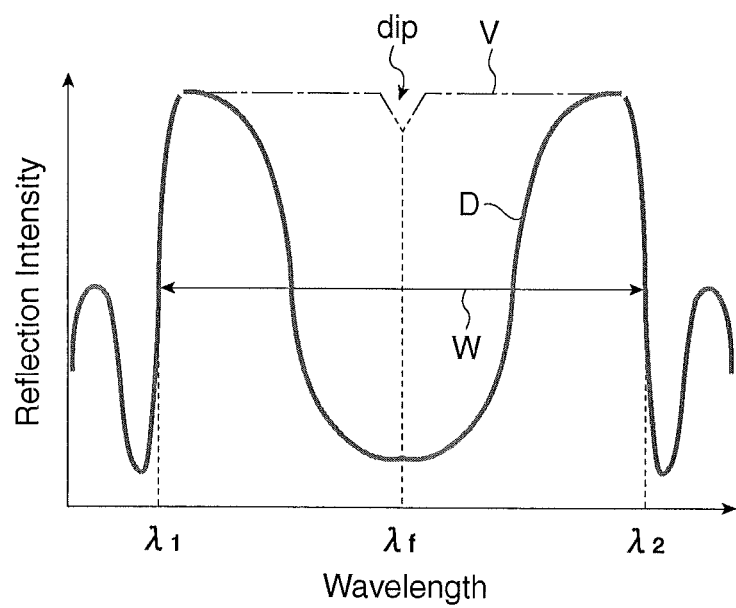
FIG. 5 is a graph schematically showing a reflectance profile of a multilayer film in accordance with an embodiment of the invention.

In the first examination step, when the total optical film thickness of the semiconductor layer 122 and the sacrificial layer 60 is an even multiple of $\lambda/4$, a reflectance profile D that is shown, for example, in FIG. 5 can be obtained. It is noted that FIG. 5, and FIG. 6 (to be describe below) show a reflectance profile V of a multilayer film composed of a first mirror 102, an active layer 103 and a second mirror 104 formed on the substrate 101 (in other words, the multilayer film without having the semiconductor layer 122) in a dot-and-dash line. In accordance with the present embodiment, for example, as indicated by the reflectance profile V, a region W between wavelengths $\lambda_1$ and $\lambda_2$ at which the reflectance becomes half of its maximum value can be set as a reflection band of the DBR mirrors composing the first mirror 102 and the second mirror 104. A dip is observed in the reflectance profile V of the multilayer film that does not have the semiconductor layer 122, as shown in FIG. 5. The wavelength at the lowest point of the dip is a Fabry-Perot wavelength $\lambda_f$ of light that is emitted from the surface-emitting laser section 140.

It is noted that, for example, when the total optical film thickness of the semiconductor layer 122 and the sacrificial layer 60 is an even multiple of $\lambda/4$, a reflectance profile D of the first multilayer film 150 shown in FIG. 5 is obtained. With the reflectance profile D, photoabsorption that is originated from the semiconductor layer 122 occurs near the dip described above, such that measurement of a Fabry-Perot wavelength $\lambda_f$ becomes difficult. However, the above-described reflection band W of the first mirror 102 and the second mirror 104 can be accurately measured.

Figure 6:
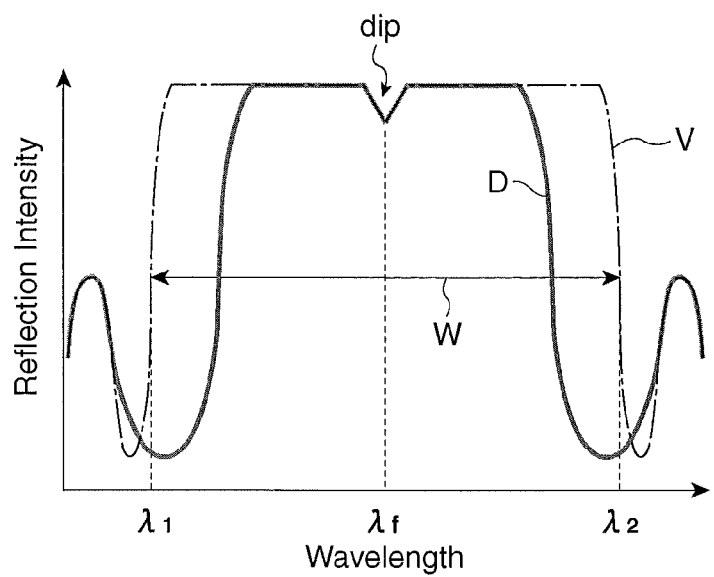
FIG. 6 is a graph schematically showing a reflectance profile of a multilayer film in accordance with an embodiment of the invention.

Also, in the first examination step, when the total optical film thickness of the semiconductor layer 122 and the sacrificial layer 60 is an odd multiple of $\lambda/4$, a reflectance profile D that is shown, for example, in FIG. 6 is obtained. With the reflectance profile D of the first multilayer film 150 in this case, photoabsorption that is originated from the semiconductor layer 122 occurs near both ends of the reflection band W of the DBR mirrors, as shown in FIG. 6, such that measurement of the reflection band W of the DBR mirrors becomes difficult. However, the Fabry-Perot wavelength $\lambda_f$ indicated by the above-described dip can be accurately measured.

(3) Next, as shown in FIG. 7, the sacrificial layer 60 is removed from the first multilayer film 150, thereby forming a second multilayer film 152. The sacrificial layer 60 may be removed by, for example, a wet etching method. When the sacrificial layer 60 is removed, a layer that is in contact with the sacrificial layer 60 among the semiconductor layer 122 (e.g., the second contact layer 113 in the illustrated example) can be functioned as an etching stopper layer. As the etchant used in this step, an etchant with which the etching stopper layer (e.g., the second contact layer 113) would be more difficult to be etched compared to the sacrificial layer 60 may be selected. In other words, an etchant with which the etching rate of the second contact layer 113 is lower than the etching rate of the sacrificial layer 60 can be selected. By this, when etching the sacrificial layer 60, the etching can be readily stopped at the time when the top surface of the second contact layer 113 is exposed. In the present embodiment, for example, the sacrificial layer 60 may be composed of InGaP, and the second contact layer 113 may be composed of AlGaAs or GaAs. In this case, a mixed solution of phosphoric acid ($H_3PO_4$), hydrogen peroxide solution ($H_2O_2$) and water may be used as the etchant, whereby the etching rate of the second contact layer 113 can be made lower. Also, in the present embodiment, for example, the sacrificial layer 60 may be composed of AlGaAs, and the second contact layer 113 may be composed of GaAs. In this case, diluted hydrofluoric acid ($HF+H_2O$) or buffered hydrofluoric acid ($NH_4F+H_2O$) may be used as the etchant, whereby the etching rate of the second contact layer 113 can be made lower.

It is noted that, for example, the sacrificial layer 60 and the second contact layer 113 may be composed of the same material. In this case, when etching the sacrificial layer 60, for example, the etching time may be controlled, whereby the etching can be stopped at the time when the top surface of the second contact layer 113 is exposed.

(4) Next, a reflectance examination (second examination step) is conducted on the second multilayer film 152. The reflectance examination may be conducted in a manner similar to the first examination step described above, as shown in FIG. 7.

For example, when the total optical film thickness of the semiconductor layer 122 and the sacrificial layer 60 is an even multiple of $\lambda/4$ in the first examination step, a reflectance profile D that is shown, for example, in FIG. 6 is obtained because the optical film thickness of the semiconductor layer 122 is an odd multiple of $\lambda/4$ in the second examination step. With the reflectance profile D of the second multilayer film 152 in this case, the Fabry-Perot wavelength $\lambda_f$ indicated by the dip can be accurately measured, as shown in FIG. 6, in a similar manner described above with respect to the first examination step. Accordingly, in this case, as described above, the reflection band W of the first mirror 102 and the second mirror 104 can be accurately observed (first measurement) in the first examination step, and the Fabry-Perot wavelength $\lambda_f$ can be accurately measured (second measurement) in the second examination step.

Further, for example, when the total optical film thickness of the semiconductor layer 122 and the sacrificial layer 60 is an odd multiple of $\lambda/4$ in the first examination step, a reflectance profile D that is shown, for example, in FIG. 5 is obtained because the optical film thickness of the semiconductor layer 122 is an even multiple of $\lambda/4$ in the second examination step. With the reflectance profile D of the second multilayer film 152 in this case, the reflection band W of the first mirror 102 and the second mirror 104 can be accurately observed, as shown in FIG. 5, in a similar manner described above with respect to the first examination step. Accordingly, in this case, as described above, the Fabry-Perot wavelength $\lambda_f$ can be accurately measured (second measurement) in the first examination step, and the reflection band W of the first mirror 102 and the second mirror 104 can be accurately observed (first measurement) in the second examination step.

(5) Then, the second multilayer film 152 is patterned, thereby forming a first mirror 102, an active layer 103, a second mirror 104, and a semiconductor layer 122 (including an isolation layer 20, a first contact layer 111, a photoabsorption layer 112 and a second contact layer 113) each in a desired configuration, as shown in FIG. 8. By this, each of the columnar sections is formed. The second multilayer film 152 may be patterned by using, for example, lithography technique and etching technique.

Then, by placing the substrate 101 on which the columnar sections are formed through the aforementioned steps in a water vapor atmosphere, for example, at about 400° C., the layer to be oxidized described above is oxidized from its side surface, thereby forming the current constricting layer 105.

(6) Next, as shown in FIG. 1 through FIG. 3, a first dielectric layer 30 is formed on the first mirror 102. First, a dielectric layer composed of polyimide resin or the like is formed over the entire surface by using, for example, a spin coat method. Then, the top surface of the columnar section 130 is exposed by using, for example, an etch-back method. Then, the dielectric layer is patterned by, for example, lithography technique and etching technique. In this manner, the first dielectric layer 30 in a desired configuration can be formed.

Then, as shown in FIG. 1 through FIG. 3, a second dielectric layer 32 is formed on the second mirror 104 and the first dielectric layer 30. First, a dielectric layer composed of silicon oxide or the like is formed over the entire surface by using, for example, a plasma CVD method. Then, the dielectric layer is patterned by using, for example, lithography technique and etching technique. In this manner, the second dielectric layer 32 in a desired configuration can be formed.

Then, as shown in FIG. 1 through FIG. 3, a third dielectric layer 40 is formed on the first contact layer 111 and the second dielectric layer 32. The method for forming the third dielectric layer 40 may be the same as, for example, the method for forming the second dielectric layer 32 described above.

Then, first through fourth electrodes 107, 109, 116 and 110 are formed. The electrodes may be formed in desired configurations, respectively, by, for example, a combination of a vacuum vapor deposition method and a lift-off method, or the like. The order of forming the electrodes is not particularly limited.

(7) By the steps described above, the optical device 100 in accordance with the present embodiment is formed, as shown in FIG. 1 through FIG. 3.

3. In accordance with the present embodiment, as described above, a reflectance profile of the first multilayer film 150 is obtained in the first examination step, and a reflectance profile of the second multilayer film 152 is obtained in the second examination step, such that the multilayer film obtained through forming layers above the substrate 101 can be accurately evaluated. By this, manufacturer of an optical device with a defective multilayer film can be avoided beforehand. Accordingly, by the method for manufacturing an optical device 100 in accordance with the present embodiment, the optical device 100 having desired characteristics can be securely provided.

Figure 9:
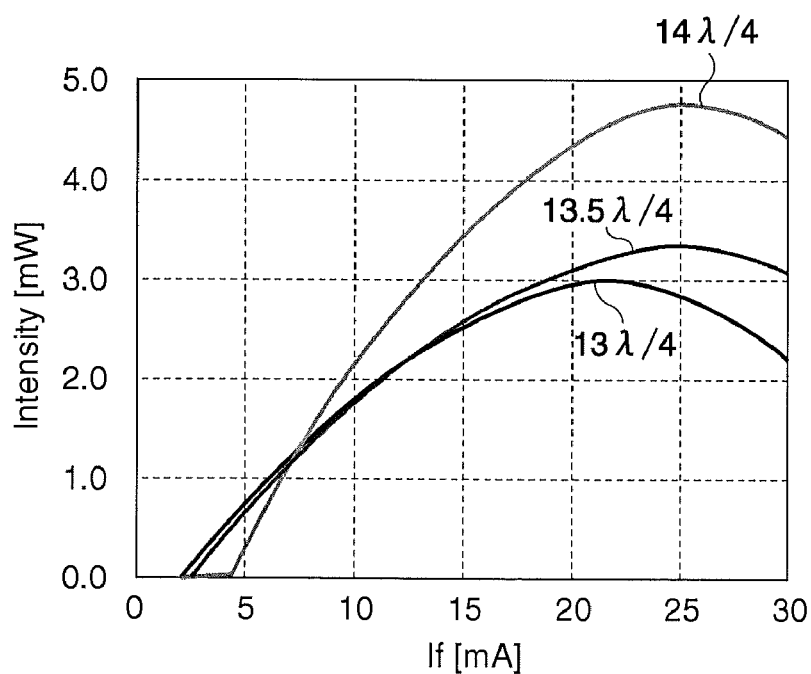
FIG. 9 is a graph showing the relation between the optical film thickness of a pin section and the output of an optical device.

Also, in accordance with the present embodiment, when the optical film thickness of the isolation layer 20 is an odd multiple of $\lambda/4$, the total optical film thickness of the first contact layer 111, the photoabsorption layer 112 and the second contact layer 113 (i.e., the pin section) may preferably be an odd multiple of λ/4. FIG. 9 is a graph showing the relation between the optical film thickness of the pin section and the output of the optical device 100. In FIG. 9, currents are plotted along the axis of abscissa, and outputs are plotted along the axis of ordinates. Also, FIG. 9 shows the relations with the optical film thickness of the pin section being 13 times (an odd multiple) λ/4, 13.5 times (between an odd multiple and an even multiple) λ/4, and 14 times (an even multiple) λ/4, respectively.

As shown in FIG. 9, by setting the optical film thickness of the pin section at an odd multiple of λ/4, the threshold current of the optical device 100 can be reduced, compared to the cases of the other optical film thicknesses.

On the other hand, in accordance with the present embodiment, as described above, even when the optical film thickness of the pin section is set to an odd multiple of λ/4, the multilayer film obtained through forming layers on the substrate 101 can be accurately evaluated.

In view of the above, by the method for manufacturing the optical device 100 in accordance with the present embodiment, the optical device 100 whose threshold value is reduced, and having desired characteristics can be reliably provided.

4. Next, modified examples of the present embodiment are described. It is noted that features different from those of the embodiment example described above (hereafter referred to as the "example of optical device 100") shall be described, and description of the other features shall be omitted. Also, members having similar functions as those of the example of optical device 100 shall be appended with the same reference numbers.

Figure 10:
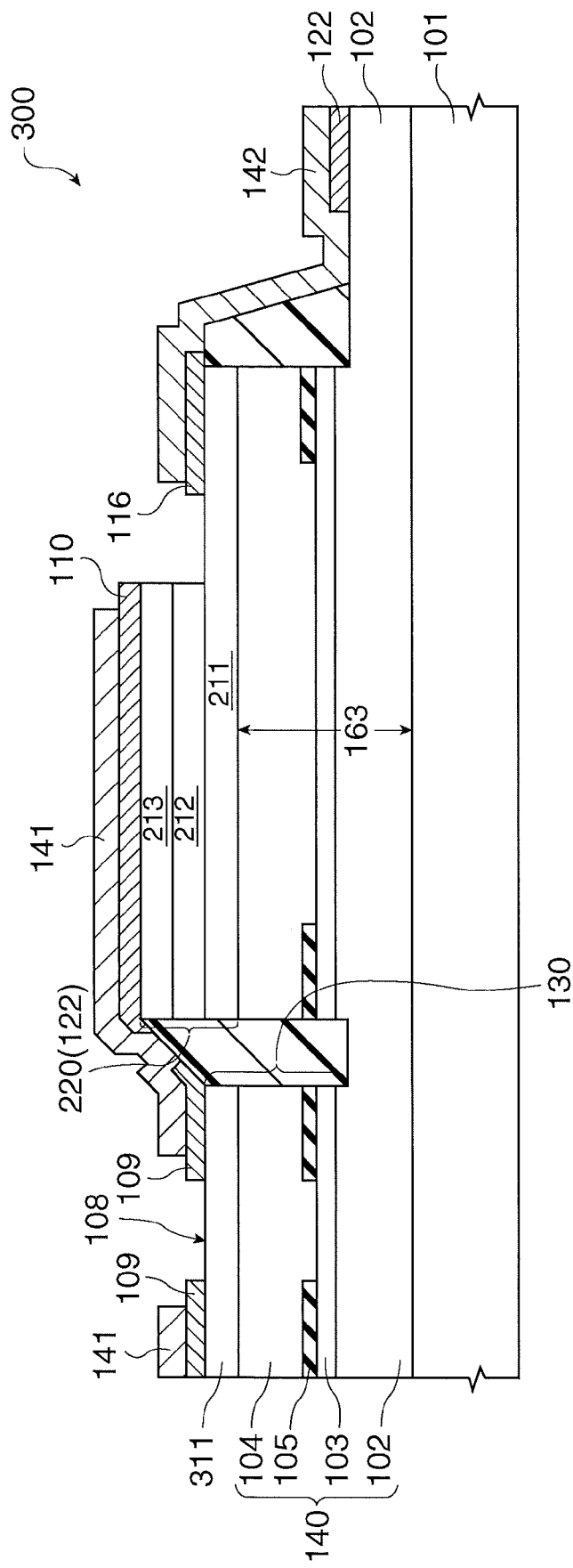
FIG. 10 is a cross-sectional view schematically showing a first modified example of the optical device in accordance with the present embodiment.

(1) First, a first modified example is described. FIG. 10 is a schematic cross-sectional view of an optical device 300 in accordance with the modified example.

In the optical device 300 in accordance with the modified example, a diode section 220 is formed on a support section 163 that is composed of layers that are commonly formed with a first mirror 102, an active layer 103 and a second mirror 104, respectively. It is noted that, as the top surface of the support section 163 is at the same height as the top surface of the second mirror 104, the diode section 220 can be said to be formed on the second mirror 104.

The diode section 220 may be composed of a diode having a rectification action, such as, a pn junction diode, a Schottky barrier diode, or the like. The diode section 220 may be electrically connected in parallel with the surface-emitting laser section 140 by a first connection electrode 141 and a second connection electrode 142. The diode section 220 may have a rectification action in a reverse direction with respect to that of the surface-emitting laser section 140.

The diode section 220 may include, as shown in FIG. 10, for example, a first contact layer 211 formed on the support section 163, a capacitance reducing layer 212 formed on the first contact layer 211, and a second contact layer 213 formed on the capacitance reducing layer 212. The first contact layer 211 may be composed of, for example, p-type GaAs, the capacitance reducing layer 212 may be composed of, for example, a GaAs layer in which no impurity is doped, and the second contact layer 213 may be composed of, for example, n-type GaAs. In the present modified example, the entirety of the first contact layer 211, the capacitance reducing layer 212 and the second contact layer 213 corresponds to the semiconductor layer 122 of the example of optical device 100. It is noted that the contact layer 311 that is formed on the surface-emitting laser section 140 and is a layer common with the first contact layer 211 can electrically connect the second mirror 104 of the surface-emitting laser section 140 with the second electrode 109.

In accordance with the present modified example, reflectance profiles can also be obtained by a first examination step and a second examination step, like the example of optical device 100, such that the multilayer film obtained through forming layers above the substrate 101 can be accurately evaluated.

(2) Next, a second modified example is described.

In the present modified example, the substrate 101 in the example of optical device 100 may be separated by using, for example, an epitaxial lift off (ELO) method. In other words, the optical device 100 in accordance with the present modified example may not be provided with the substrate 101.

Figure 11:
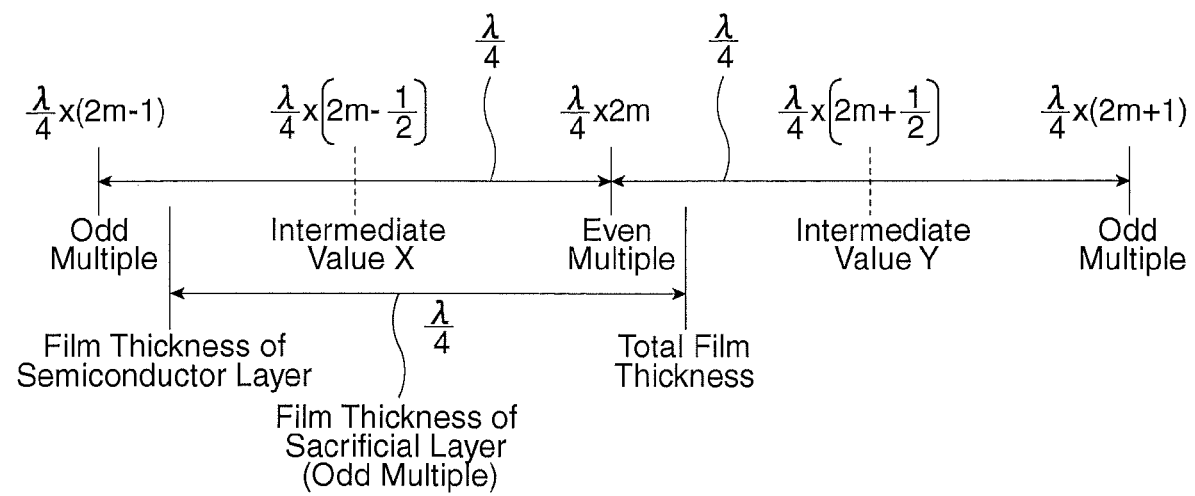
FIG. 11 is a diagram showing a third modified example of the optical device in accordance with the present embodiment.

(3) Next, a third modified example is described. FIG. 11 is a diagram typically showing the relation among an optical film thickness of a semiconductor layer 122, an optical film thickness of a sacrificial layer 60, and the total optical film thickness of the semiconductor layer 122 and the sacrificial layer 60 in accordance with the modified example.

In the example of optical device 100, the case in which the optical film thickness of the semiconductor layer 122 is an odd multiple or an even multiple of λ/4 is described. In the present modified example, the optical film thickness of the semiconductor layer 122 is, for example, as shown in FIG. 11, greater than an odd multiple of λ/4, for example, greater than (λ/4)×(2m−1) (m is a natural number) and smaller than an intermediate value X between an odd multiple of λ/4 and an even multiple of λ/4, for example, smaller than (λ/4)×{2m−(1/2)}. The optical film thickness of the sacrificial layer 60 is an odd multiple of λ/4, like the example of optical device 100. Accordingly, the total optical film thickness of the semiconductor layer 122 and the sacrificial layer 60 is greater than an even multiple of λ/4, for example, greater than (λ/4)×2m, and smaller than an intermediate value Y between an even multiple of λ/4 and an odd multiple of λ/4, for example, smaller than (λ/4)×{2m+(1/2)}.

In accordance with the present modified example, reflectance profiles can also be obtained by a first examination step and a second examination step, like the example of optical device 100. Therefore, in the case of the example described above, the reflection band W of the first mirror 102 and the second mirror 104 can be accurately observed in the first examination step, and the Fabry-Perot wavelength $\lambda_f$ can be accurately measured in the second examination step.

It is noted that, in the present modified example, the relation between the optical film thickness of the semiconductor layer 122 and the total optical film thickness of the semiconductor layer 122 and the sacrificial layer 60 is not limited to the example described above. Table 1 below shows, in a simplified fashion, combinations of the optical film thickness of the semiconductor layer 122 and the total optical film thickness of the semiconductor layer 122 and the sacrificial layer 60, in the case of the example of optical device 100 (a), and in the case of the modified example (b). Also, Table 1 shows items (the reflection band W and the Fabry-Perot wavelength $\lambda_f$) measured in the first examination step and the second examination step.

TABLE 1

| | Film Thickness of Semiconductor Layer | Film Thickness of Sacrificial Layer | Total Film Thickness | First Examination | Second Examination |
|---|---|---|---|---|---|
| (a) | Odd Multiple | Odd Multiple | Even Multiple | W | $\lambda_f$ |
| | Even Multiple | | Odd Multiple | $\lambda_f$ | W |
| (b) | Greater than Odd Multiple Smaller than Intermediate Value X | | Greater than Even Multiple Smaller than Intermediate Value Y | W | $\lambda_f$ |
| | Greater than Intermediate Value X Smaller than Even Multiple | | Greater than Intermediate Value Y Smaller than Odd Multiple | $\lambda_f$ | W |
| | Greater than Even Multiple Smaller than Intermediate Value Y | | Greater than Odd Multiple Smaller than Intermediate Value X | $\lambda_f$ | W |
| | Greater than Intermediate Value Y Smaller than Odd Multiple | | Greater than Intermediate Value X Smaller than Even Multiple | W | $\lambda_f$ |

(4) It is noted that the modified examples described above are only examples, and the invention is not limited to these examples. For example, the modified examples may be appropriately combined.

5. Embodiments of the invention are described above in detail. However, a person having an ordinary skill in the art should readily understand that many modifications can be made without departing in substance from the novel matter and effect of the invention. Accordingly, those modified examples are also deemed included in the scope of the invention.

What is claimed is:

1. A method for manufacturing an optical device, the method comprising the steps of:
   forming a first multilayer film, including forming a first mirror above a substrate, forming an active layer above the first mirror, forming a second mirror above the active layer, forming a semiconductor layer on the second mirror, and forming a sacrificial layer on the semiconductor layer;
   conducting a first examination step of conducting a reflectance examination on the first multilayer film;
   forming a second multilayer film by removing the sacrificial layer from the first multilayer film;
   conducting a second examination step of conducting a reflectance examination on the second multilayer film; and
   patterning the second multilayer film to form a surface-emitting laser section having the first mirror, the active layer and the second mirror, and a diode section having the semiconductor layer,
   the sacrificial layer being formed to have an optical film thickness of an odd multiple of $\lambda/4$, where $\lambda$ is a design wavelength of light emitted by the surface-emitting laser section.

2. A method for manufacturing an optical device according to claim 1, the semiconductor layer being formed to have an optical film thickness of an odd multiple or an even multiple of $\lambda/4$.

3. A method for manufacturing an optical device according to claim 1, the semiconductor layer being formed to have an optical film thickness of an odd multiple of $\lambda/4$, a reflection band of the first mirror and the second mirror being measured in the first examination step, and a Fabry-Perot wavelength of light emitted by the surface-emitting laser section being measured in the second examination step.

4. A method for manufacturing an optical device according to claim 1, the semiconductor layer being formed to have an optical film thickness of an even multiple of $\lambda/4$, a Fabry-Perot wavelength of light emitted by the surface-emitting laser section being measured in the first examination step, and a reflection band of the first mirror and the second mirror being measured in the second examination step.

5. A method for manufacturing an optical device according to claim 1, in the step of removing the sacrificial layer, a layer among the semiconductor layer in contact with the sacrificial layer functions as an etching stopper layer.

6. A method for manufacturing an optical device according to claim 5, the sacrificial layer being formed from InGaP, and the layer among the semiconductor layer in contact with the sacrificial layer being formed from AlGaAs or GaAs.

7. A method for manufacturing an optical device according to claim 5, the sacrificial layer being formed from AlGaAs, and the layer among the semiconductor layer in contact with the sacrificial layer being formed from GaAs.

8. A method for manufacturing an optical device according to claim 1, the diode section being formed to be a photodetector section, and the semiconductor layer being formed to include a photoabsorption layer.

9. A method for manufacturing an optical device according to claim 1, the semiconductor layer including a first contact layer of a first conductivity type, and a second contact layer of a second conductivity type formed above the first contact layer.

10. A method for manufacturing an optical device according to claim 1, each of the first mirror and the second mirror being formed from a distributed Bragg reflection type mirror, and an optical film thickness of each layer in the distributed Bragg reflection type mirror being $\lambda/4$.

11. A method for manufacturing an optical device comprising:
   forming a first multilayer film, including forming a first mirror above a substrate, forming an active layer above the first mirror, forming a second mirror above the active layer, forming a semiconductor layer on the second mirror, and forming a sacrificial layer on the semiconductor layer;

conducting a first examination step of conducting a reflectance examination on the first multilayer film;

forming a second multilayer film by removing the sacrificial layer from the first multilayer film;

conducting a second examination step of conducting a reflectance examination on the second multilayer film; and patterning the second multilayer film to form a surface-emitting laser section having the first mirror, the active layer and the second mirror, and a diode section having the semiconductor layer, in the first examination step, one of a first measurement of measuring a reflection band of the first mirror and the second mirror and a second measurement of measuring a Fabry-Perot wavelength of light emitted by the surface-emitting laser section being conducted; and in the second examination step, the second measurement being conducted when the first measurement is conducted in the first examination step, and the first measurement being conducted when the second measurement is conducted in the first examination step.

* * * * *